US012812835B2

(12) United States Patent
Singh et al.

(10) Patent No.: US 12,812,835 B2
(45) Date of Patent: Nov. 24, 2026

(54) INTEGRATED CIRCUIT STRUCTURE FOR LOW POWER SRAM

(71) Applicant: TAIWAN SEMICONDUCTOR MANUFACTURING CO., LTD., Hsinchu (TW)

(72) Inventors: Gulbagh Singh, Uttar Pradesh (IN); Shun-Chi Tsai, Tainan City (TW); Chih-Ming Lee, Tainan City (TW); Chi-Yen Lin, Tainan City (TW); Kuo-Hung Lo, Hsinchu City (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 317 days.

(21) Appl. No.: 18/755,162

(22) Filed: Jun. 26, 2024

(65) Prior Publication Data

US 2024/0349475 A1 Oct. 17, 2024

Related U.S. Application Data

(63) Continuation of application No. 17/885,166, filed on Aug. 10, 2022, now Pat. No. 12,052,851, which is a (Continued)

(51) Int. Cl.

| | |
|---|---|
| ***H10B 10/00*** | (2023.01) |
| ***H10D 62/10*** | (2025.01) |
| ***H10D 64/27*** | (2025.01) |
| ***H10D 84/01*** | (2025.01) |
| ***H10D 84/03*** | (2025.01) |

(Continued)

(52) U.S. Cl.

CPC ........... *H10B 10/12* (2023.02); *H10D 62/115* (2025.01); *H10D 64/519* (2025.01); *H10D 84/0149* (2025.01); *H10D 84/038* (2025.01); *G11C 11/412* (2013.01); *H10D 89/10* (2025.01)

(58) Field of Classification Search

CPC ............. H10L 27/0207; H10L 27/0211; H10L 27/11–1116; G11C 11/412; H01L 27/0207; H01L 27/0211

See application file for complete search history.

(56) References Cited

U.S. PATENT DOCUMENTS

| | | | |
|---|---|---|---|
| 9,761,662 | B1 | 9/2017 | Paul et al. |
| 10,090,308 | B1 | 10/2018 | Chen |

(Continued)

FOREIGN PATENT DOCUMENTS

| | | | |
|---|---|---|---|
| TW | 201342535 | A | 10/2013 |
| TW | 201515154 | A | 4/2015 |

(Continued)

*Primary Examiner* — Eric A. Ward

(74) *Attorney, Agent, or Firm* — Maschoff Brennan

(57) ABSTRACT

An IC structure includes a first gate strip and a first active region under the first gate strip and forming a first transistor with the first gate strip. From a top view, the first active region has opposite short sides and opposite long sides connecting the short sides and longer than the short sides. First one of the long sides has a first stepped top-view profile. Second one of the long sides has a second stepped top-view profile. The first stepped top-view profile has more step rises than the second stepped top-view profile.

20 Claims, 14 Drawing Sheets

1100

Related U.S. Application Data continuation of application No. 16/994,900, filed on Aug. 17, 2020, now Pat. No. 11,462,550, which is a continuation of application No. 16/020,855, filed on Jun. 27, 2018, now Pat. No. 10,748,911.

(60) Provisional application No. 62/585,280, filed on Nov. 13, 2017.

(51) Int. Cl.
*G11C 11/412* (2006.01)
*H10D 89/10* (2025.01)

(56) References Cited

U.S. PATENT DOCUMENTS

| | | | | |
|---|---|---|---|---|
| 2006/0146638 | A1 | 7/2006 | Chang et al. | |
| 2007/0080423 | A1 | 4/2007 | Tsuboi et al. | |
| 2008/0180980 | A1* | 7/2008 | Huang | G11C 11/412 365/51 |
| 2008/0308848 | A1 | 12/2008 | Inaba | |
| 2009/0134473 | A1 | 5/2009 | Tanaka | |
| 2010/0038684 | A1 | 2/2010 | Parikh et al. | |
| 2012/0026808 | A1 | 2/2012 | Houston et al. | |
| 2012/0043615 | A1 | 2/2012 | Yamada | |
| 2012/0220094 | A1 | 8/2012 | Okuno et al. | |
| 2012/0228714 | A1 | 9/2012 | Lim et al. | |
| 2013/0069168 | A1* | 3/2013 | Blatchford | H10B 10/12 257/E27.098 |
| 2013/0258759 | A1 | 10/2013 | Liaw | |
| 2013/0299905 | A1* | 11/2013 | Lee | H10B 10/12 257/E27.06 |
| 2013/0328127 | A1 | 12/2013 | Chen et al. | |
| 2014/0167177 | A1 | 6/2014 | Kim et al. | |
| 2015/0009750 | A1 | 1/2015 | Schaefer et al. | |
| 2016/0307802 | A1 | 10/2016 | Lee et al. | |
| 2017/0018302 | A1 | 1/2017 | Mn et al. | |
| 2018/0286474 | A1 | 10/2018 | Chen et al. | |

FOREIGN PATENT DOCUMENTS

| | | | |
|---|---|---|---|
| TW | 201637099 | A | 10/2016 |
| TW | 201703234 | A | 1/2017 |

* cited by examiner

INTEGRATED CIRCUIT STRUCTURE FOR LOW POWER SRAM

PRIORITY CLAIM AND CROSS-REFERENCE

The present application is a Continuation Application of U.S. application Ser. No. 17/885,166, filed Aug. 10, 2022, which is a Continuation Application of U.S. application Ser. No. 16/994,900, filed Aug. 17, 2020, now U.S. Pat. No. 11,462,550, issued on Oct. 4, 2022, which is a Continuation Application of U.S. application Ser. No. 16/020,855, filed Jun. 27, 2018, now U.S. Pat. No. 10,748,911, issued on Aug. 18, 2020, which claims priority to U.S. Provisional Application Ser. No. 62/585,280, filed Nov. 13, 2017, all of which are herein incorporated by reference in their entireties.

BACKGROUND

The continuing and increasing demand for low power integrated circuits, particularly for more complicated battery powered, portable devices, requires that SRAM cells have good power consumption characteristics. One measure of the power consumption is the standby leakage current $I_{sb}$. When the SRAM cell is not being used, the SRAM array may be placed in a standby mode. The leakage current consumed during standby, $I_{sb}$, should be minimized. It is clearly advantageous to provide SRAM cells with a low $I_{sb}$ value. This is difficult to do reliably for the 6T storage cells, however, due to process variations and other constraints increasingly imposed by shrinking device sizes. For example, the contact material is often seen leaking to the shallow trench isolation. The overlap region between the gate and the active region causes gate leakage.

Thus, there is a continuing need for a SRAM bit cell structures that has a lower standby leakage current $I_{sb}$ for lower standby power and improved access speed particularly during read operations, while remaining compatible with state of the art semiconductor process for fabricating integrated circuits, without adding significant steps or significant added costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
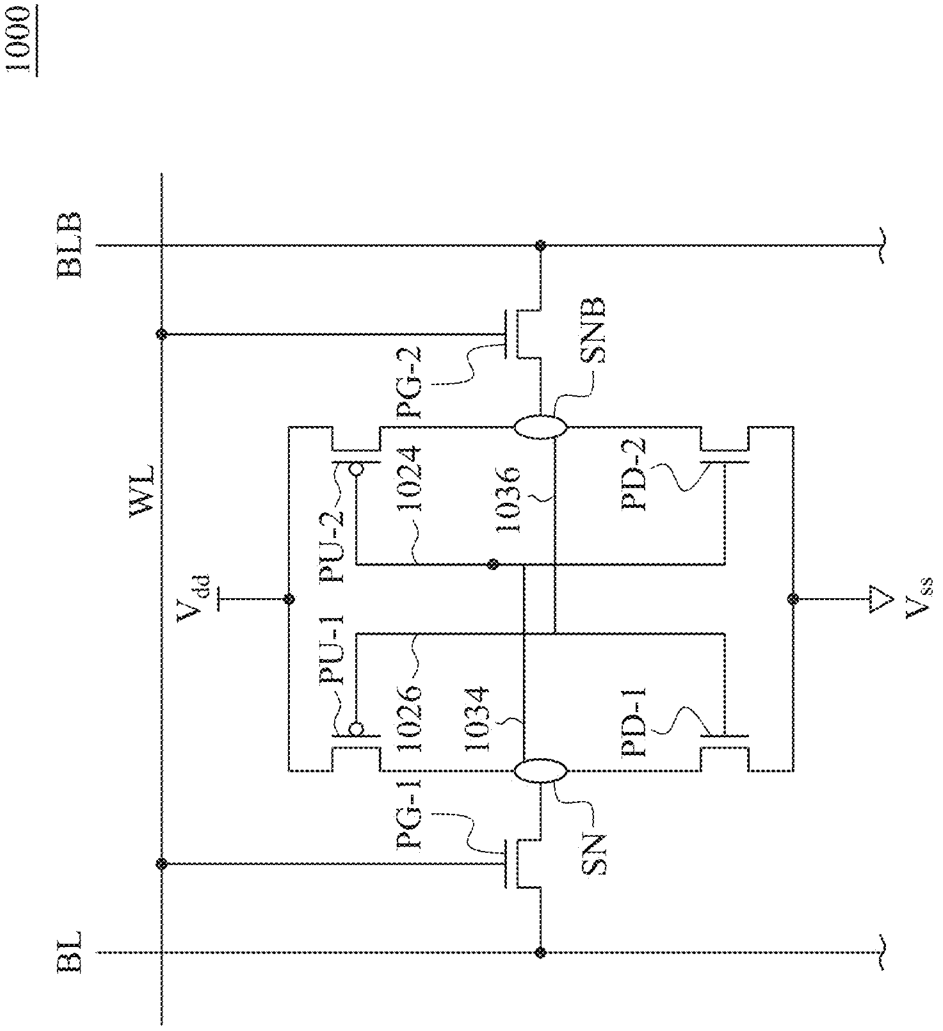
FIG. 1 illustrates a circuit diagram of a 6T SRAM bit in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
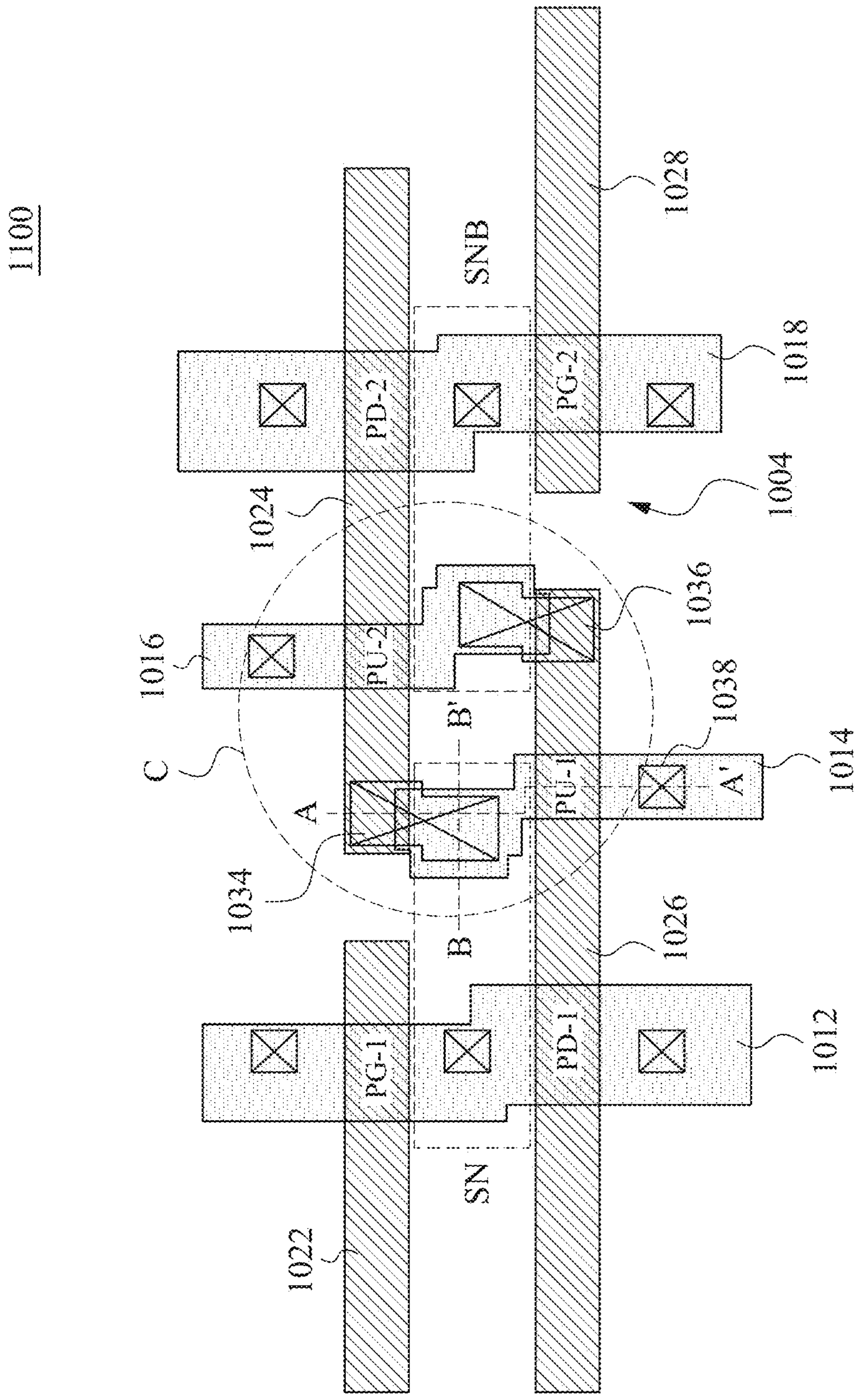
FIG. 2 illustrates in a simple layout diagram the layout of an SRAM bit cell circuit in accordance with some embodiments of the instant disclosure.

FIG. 1 is a circuit diagram 1000 and FIG. 2 is a layout 1100 of an example 6T (transistors) SRAM (static random-access memory) bit. (Note that the geometries on SRAM bits in actual layouts incorporating this embodiment may differ significantly from those shown in FIG. 2.) Equivalent elements are referenced by the same number in both FIGS. 1 and 2 for clarity. The 6T SRAM bit contains 6 transistors: two NMOS (n-channel metal-oxide-semiconductor) pass gate transistors, PG-1 and PG-2, two NMOS pull down (driver) transistors, PD-1 and PD-2, and two PMOS (p-channel metal-oxide-semiconductor) pull up (load) transistors, PU-1 and PU-2. The NMOS pull down transistor PD-1 plus the PMOS pull up transistor PU-1 form a first inverter, and the NMOS pull down transistor PD-2 plus the PMOS pull up transistor PU-2 form a second inverter. A storage node SN (which is indicated by the dotted line box in FIG. 2) is formed by the source/drain of the NMOS pull down transistor PD-1 and the PMOS pull up transistor PU-1 of the first inverter. The butted contact 1034 shorts the storage node SN to the gate electrode 1024 of the second inverter. Therefore, the voltage on the storage node SN controls the voltage on the gate 1024 of the second inverter.

Likewise, a storage node bar SNB (which is indicated by the dotted line box in FIG. 2) is formed by the source/drain of the NMOS pull down transistor PD-2 and the PMOS pull up transistor PU-2. The butted contact 1036 shorts the storage node bar SNB to the gate electrode 1026 of the first inverter. Therefore, the voltage on the storage node bar SNB controls the gate electrode 1026 voltage of the first inverter.

Reference is still made to FIG. 1. The sources of the PMOS pull up (load) transistors PU-1 and PU-2 are connected to the array voltage, Vad (which is usually the power supply voltage that may be from 0.6 volts to 3.0 or more volts). The sources of the NMOS pull down (driver) transistors PD-1 and PD-2 are connected to Vss (which typically is ground). The source of the NMOS pass gate transistor PG-1 is connected to the storage node SN, and the drain is connected to a bit line BL. The drain of the NMOS pass gate transistor PG-2 is connected to the storage node bar SNB and the source of the NMOS pass gate transistor PG-2 is connected to a bit line bar BLB. The gates of both pass gate transistors, PG-1 and PG-2, are connected to word line WL. The 6T SRAM bit cell is a latch that will retain its data state indefinitely so long as the supplied power is sufficient to operate the circuit correctly. Two CMOS inverters formed of PU-1, PD-1 and PU-2, PD-2 are cross coupled and they operate to reinforce the stored charge on the storage node SN and storage node bar SNB continuously. The two storage nodes are inverted one from the other. When storage node SN is a logical "1", usually a high voltage, the storage node bar SNB is at the same time a logical "0", usually a low voltage, and vice versa.

Reference is made to FIG. 2, illustrating the SRAM cell layout 1100. In FIG. 2, an N type well may be formed in a semiconductor substrate, which may be, for example, a P type substrate, or a P doped epitaxially formed silicon layer over an insulator (SOI). FIG. 2 shows the gate electrodes 1022, 1024, 1026, and 1028 and the active areas 1012, 1014, 1016, and 1018 for the NMOS and PMOS transistors. The transistors are labelled at their gates; PG-1, PG-2, PU-1, PU-2, PD-1 and PD-2 form the 6T single port SRAM bit cell layout 1100. The contacts are labelled with the appropriate signal, word line contacts are formed for both the PG-1 and PG-2 transistors, and the cell area is defined to include these contacts and the bit line and power contacts. Two storage nodes are formed in the bit cell. The layout corresponds to the SRAM bit cell 1000 of FIG. 1.

Reference is still made to FIG. 2. The active areas 1012, 1014, 1016, and 1018 are formed between isolation features 1004 which may be, for example, STI (shallow trench isolation) or LOCOS (Local Oxidation of Silicon) isolation. The active areas 1012, 1014, 1016, and 1018 include diffusions that extend into the semiconductor substrate and may be doped to form n or p type regions and lightly doped drain regions. The active areas 1012, 1014, 1016, and 1018 may also contain additional implants to form source and drain regions. The active areas 1012, 1014, 1016, and 1018 may be in the surface of a semiconductor wafer or in a layer of silicon epitaxially formed over an insulator (SOI). The active areas 1012, 1014, 1016, and 1018 extend substantially in a first direction and are spaced apart from each other. The distance between the active areas 1012, 1014, 1016, and 1018 are not uniform. In order to densely pack the devices, the distance between active areas 1014 and 1016 is smaller than the distance between the active areas 1012 and 1014 and the distance between the active areas 1018 and 1016. The pull up transistors PU-1 and PU-2 are closer to each other, while the pull up transistor PU-1 and pull down transistor PD-1 or the pull up transistor PU-2 and pull down transistor PD-2 are further apart due to the active areas arrangement. In addition, the active areas 1012, 1014, 1016, and 1018 do not have uniform width. This feature will be elaborated later.

Transistors are formed in the bit cell area using gate electrodes 1022, 1024, 1026, and 1028 deposited and patterned over dielectric material overlying the active areas 1012, 1014, 1016, and 1018. The gate dielectric layers are not visible in this view. The gate electrodes 1022, 1024, 1026, and 1028 extend substantially in a second direction that is substantially perpendicular to the first direction. The intersections between the active areas 1012, 1014, 1016, and 1018 and the gate electrodes 1022, 1024, 1026, and 1028 are the transistors. Contacts to the metal layer are formed, and the butted contacts 1034 and 1036 that overly the gate electrode and the active area are also formed.

Figure 3A:
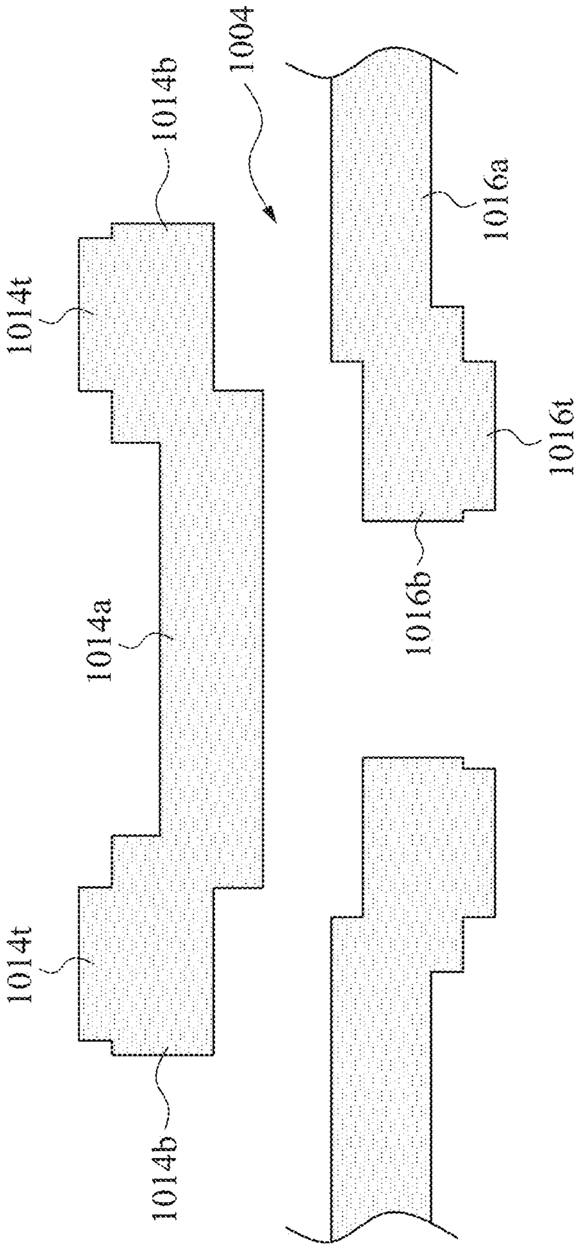
FIGS. 3A and 3B illustrate in a schematic diagram of active area configuration in accordance with some embodiments of the instant disclosure.
Figure 3B:
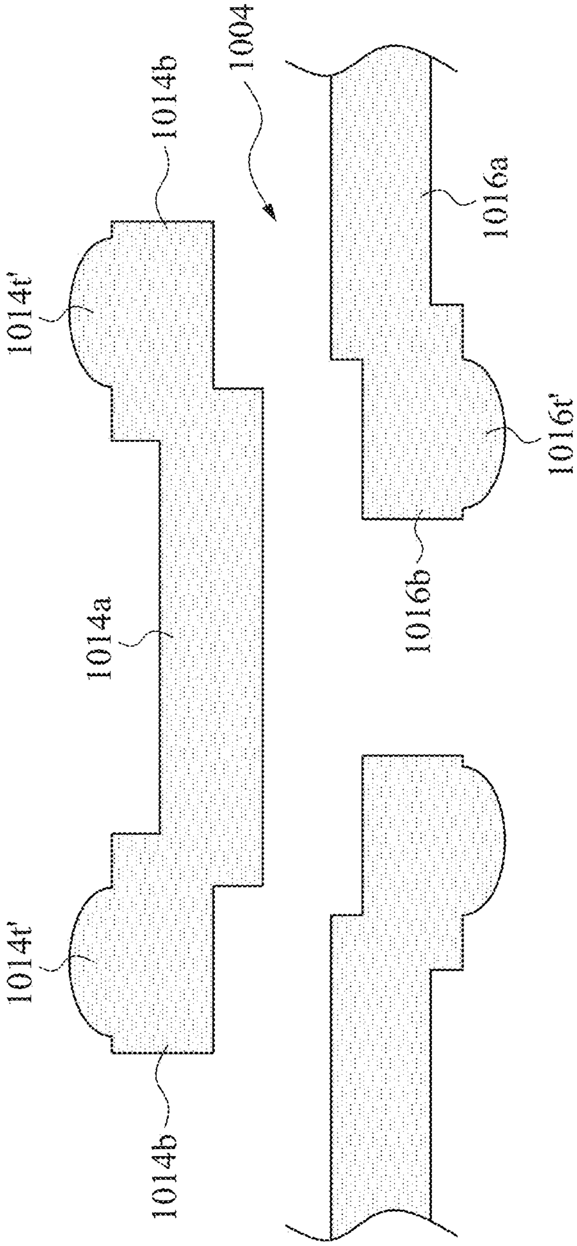

Reference is made to FIG. 3A, illustrating the active area 1014 in full and the active area 1016 and another active area in plan view. The active area 1014 has a stem portion **1014*a*, a pair of wing portions 1014*b* and a pair of tooth portions 1014*t*. The active area 1014 has a pair of wing portions 1014*b* on either side of the stem portion 1014*a*. The stem portion 1014*a* and the wing portions 1014*b* have substantially the same width, while the wing portions 1014*b* are shorter than the stem portion 1014*a* and slightly offset from the stem portion 1014*a*. The wing portions 1014*b* shift away from the stem portion 1014*a* toward the same direction, making the active area 1014 in a shape resembling a hat in which the stem portion 1014*a* raises higher than the wing portions 1014*b*. This hat-like configuration allows a more densely packed PMOS region. The tooth portions 1014*t* respectively extend from the wing portions 1014*b*. As shown in FIG. 3A, the tooth portion 1014*t* may be seen as an extension of the wing portion 1014*b* that stretches further away from the stem portion 1014*a*. In some embodiments, the tooth portion 1014*t* may be extra edges of the wing portion 1014*b* as shown in FIG. 3A. Three extra sidewalls are created by the addition of the tooth portion 1014*t*. Reference is made to FIG. 3B. In some embodiments, the tooth portion 1014*t*' may be a swelling curved corner of the wing portion 1014*b*. The tooth portion 1014*t*' may be seen as a rounded bump extending outwardly from the wing portion 1014*b*. The tooth portion 1014*t*/1014*t*' broadens the width of the wing portion 1014*b*** to one side.

Likewise the active area 1016 has a stem portion **1016*a*, a pair of wing portions 1016*b* and a pair of tooth portion 1016*t*. In FIG. 3A, the other wing portion 1016*b* is not shown. The wing portion 1016*b* shifts away from the stem portion 1014*a*. The tooth portion 1016*t* extends from the wing portion 1016*b* and stretches further away from the stem portion 1014*a*. The tooth portion 1016*t* also broadens the width of the wing portion 1016*b*** to one side.

Figure 4:
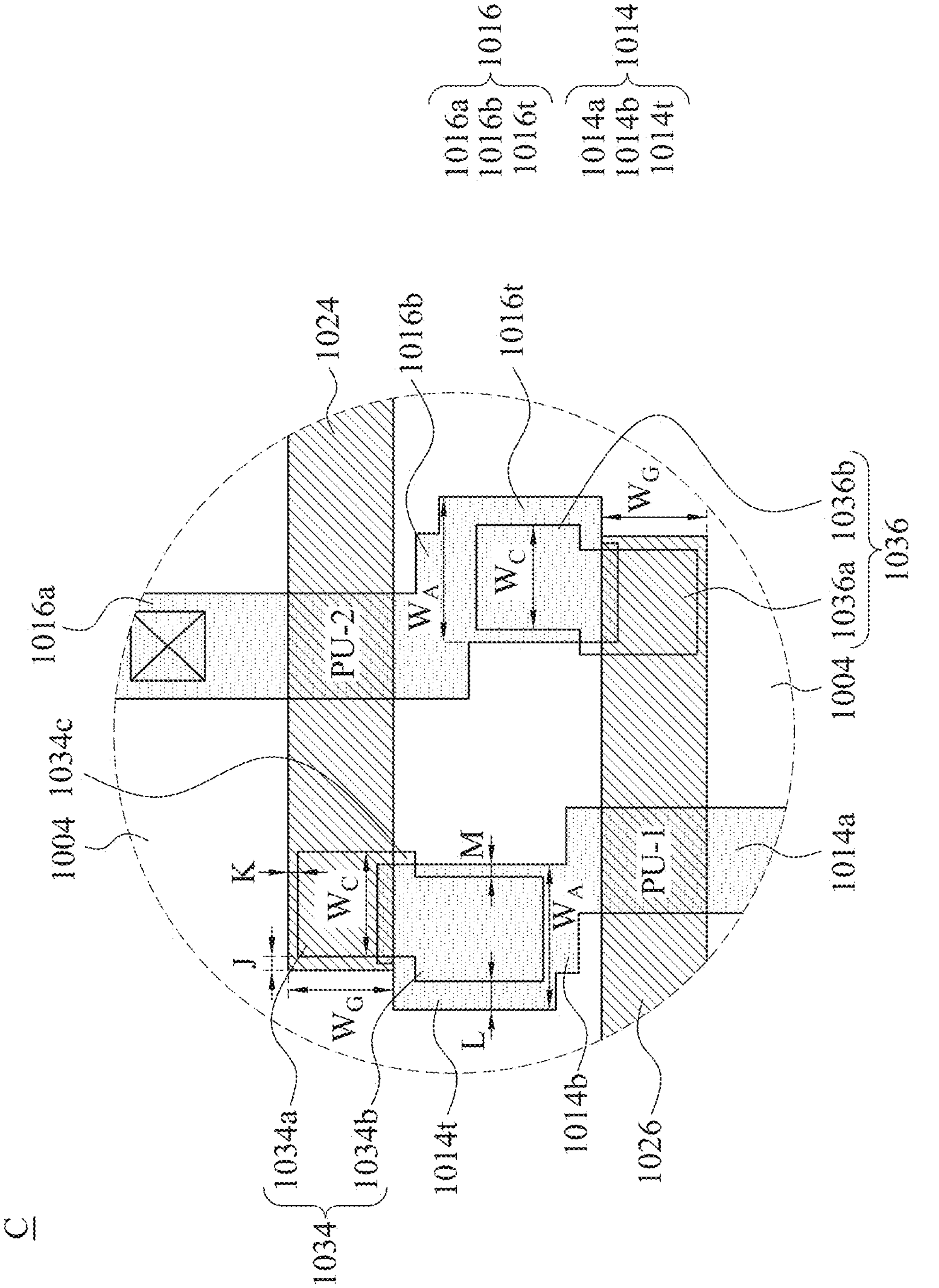
FIG. 4 illustrates an enlarge view of region C in FIG. 2.

Reference is made to FIG. 4, illustrating a zoom in view of region C of FIG. 2. The gate electrode 1024 overlies on a portion of the active area 1014 and spans across the active area 1016 to form the pull up transistor PU-2. The overlapping region between the gate electrode 1024 and the active area 1014 occurs at the wing portion **1014*b* of the active area 1014. A width of the wing portion 1014*b* that overlaps the gate electrode 1024 accounts for between about 0 and 50% (0<overlap region<50%) of the width $W_G$ of the gate electrode. For example, if the wing portion 1014*b* is separated from the gate electrode 1024 (i.e., no overlap between the wing portion 1014*b* and the gate electrode 1024), the butted contact 1034 may land on a portion of the isolation feature 1004 between the wing portion 1014*b* and the gate electrode 1024. The overlap between the isolation feature 1004 and the butted contact 1034 would result in increased junction leakage, which in turn adversely affects the performance of SRAM. Further, if the width of the wing portion 1014*b* that overlaps the gate electrode 1024 accounts for more than about 50% of the width $W_G$ of the gate electrode 1024, a great extent of gate leakage will occur between the gate electrode 1024 and the active area 1014. As a result, if the overlapping region between the active area 1014 and the gate electrode 1024 is greater than 0 and less than half of the width of the gate electrode 1024, not only the junction leakage resulting from the overlap between the isolation feature 1004 and the butted contact 1034 can be reduced, but also the gate leakage resulting from the overlap between the gate electrode 1024 and the active area 1014 can be reduced. In this context, the terms "junction leakage" as used herein is a current passing through an unintentional path from the contact to the active area through the isolation feature 1004 (e.g., STI), and the terms "gate leakage" as used herein is an unintentional current passing from the gate electrode to the active area through a gate dielectric layer therebetween. In other words, the wing portion 1014***b* of the active area 1014 has an overlapping region overlapping the gate electrode 1024. The overlapping region has a first width along the first direction. The gate electrode 1024 has a second width along the first direction. The first width is greater than 0 and less than about 50% of the second width. In some embodiments, a small overlapping region, which ranges between about 20% and 30% of the width $W_G$ of the gate electrode, remains between the gate electrode 1024 and the active area 1014 so as to allow a sufficient process window. After the deposition of the gate electrode, a series fabrication process follows up (as shown in FIGS. 7 through 11), and the overlapping region between the gate electrode 1024 and the active area 1014 makes more room for processing deviation. The gate electrode 1024 has a larger portion lands on the isolation feature 1004 than the active area 1014. The tooth portion 1014*t* of the active area 1014 does not overlap with the gate electrode 1024. The tooth portion 1014*t* is positioned between the gate electrodes 1024 and 1026. The tooth portion 1014*t* is distanced apart from the gate electrode 1026. The active area 1014 on either side of the gate electrode 1026 (PU-1) has substantially the same width. As shown in FIG. 4, the stem portion 1014*a* spans across the gate electrode 1026. In some embodiments, as shown in FIG. 4, the tooth portion 1014*t* is closer to the gate electrode 1024. One edge of the tooth portion 1014*t* is placed side by side with the one edge of the gate electrode 1024.

Reference is still made to FIG. 4. The butted contact 1034 shorts the storage node SN to the gate electrode 1024 of the second inverter. The butted contact 1034 has a first portion 1034*a* that lands on the gate electrode 1024 and a second portion 1034*b* that lands on the active area 1014. In some embodiments, the first portion 1034*a* of the butted contact 1034 offsets from the second portion 1034*b* of the butted contact 1034. The first portion 1034*a* of the butted contact 1034 extends to the second portion 1034*b* continuously. A width of the first portion 1034*a* that overlaps the gate electrode 1024 accounts for between about 30% and 100% (30%≤overlap region≤100%) of the width $W_G$ of the gate electrode. In some embodiments, as shown in FIG. 4, the width of the first portion 1034*a* of the butted contact 1034 occupies approximately 90% of $W_G$. The edges of the first portion 1034*a* are slightly distanced from the edges of the gate electrode 1024, leaving gap J and gap K. Gap J and gap K may have the same width. In some embodiments, widths of the gap J and gap K vary. For example, as shown in FIG. 4, gap J is larger than gap K. In some embodiments, the gap J accounts for between about 0 and 70% of the width $W_C$ of the butted contact 1034 (0≤the gap J<70% of the width $W_C$). For example, if the first portion 1034*a* of the butted contact 1034 is landed on the isolation feature 1004 (i.e., the gap J is negative (less than zero)), increased junction leakage may occur between the butted contact 1034 and the isolation feature 1004. Further, if the gap J is larger than about 70% of the width $W_C$ of the butted contact 1034, the butted contact 1034 may be located proximate to another contact (e.g., the butted contact 1036 on the right side of the butted contact 1034). As a result, if the gap J is between about 0 and 70% of the width $W_C$ of the butted contact 1034, the junction leakage between the butted contact 1034 and the isolation feature 1004 can be reduced, and a suitable distance between the neighboring butted contacts 1034 and 1036 can be obtained. In other words, the first portion 1034*a* of the butted contact 1034 has an edge overlapping the gate electrode 1024 and extending in the first direction (vertical direction in FIG. 4). A minimum distance from the edge of the first portion 1034*a* of the butted contact 1034 to a boundary of the gate electrode 1024 along the second direction (horizontal direction in FIG. 4) is greater than 0 and less than about 70% of a width of the first portion 1034*a* along the second direction.

In some embodiments, the gap K accounts for between about 0 and 70% of the width $W_G$ of the gate electrode 1024 (0≤the gap J<70% of the width $W_G$). For example, if the first portion 1034*a* of the butted contact 1034 extends across the upper edge of the gate electrode 1024 to land on the isolation feature 1004 (i.e., the gap K is negative (less than zero)), increased junction leakage may occur between the butted contact 1034 and the isolation feature 1004. Further, if the gap K is larger than about 70% of the width $W_G$ of the gate electrode 1024, the contact resistance between the butted contact 1034 and the gate electrode 1024 may be undesirably high. As a result, if the gap K is between about 0 and 70% of the width $W_G$ of the gate electrode 1024, the junction leakage between the butted contact 1034 and the isolation feature 1004 can be reduced, and the contact resistance between the butted contact 1034 and the gate electrode 1024 can be reduced as well. In other words, the first portion 1034*a* of the butted contact 1034 has an edge overlapping the gate electrode 1024 and extending in the second direction (horizontal direction in FIG. 4). A minimum distance from the edge of the first portion 1034*a* of the butted contact 1034 to a boundary of the gate electrode 1024 along the first direction (vertical direction in FIG. 4) is greater than 0 and less than or equal to 70% of a width of the gate electrode 1024 along the first direction.

Reference is still made to FIG. 4. The butted contact 1034 spans across from the gate electrode 1024 to the active area 1014. The second portion 1034*b* of the butted contact 1034 lands on the immediately adjacent active area 1014. More specifically, the second portion 1034*b* lands on the wing portion 1014*b* and tooth portion 1014*t*. The second portion 1034*b* of the butted contact 1034 has a width $W_C$ that is smaller than the combined width $W_A$ of the tooth portion 1014*t* and the wing portion 1014*b*. The tooth portion 1014*t* broadens the width of the wing portion 1014*b*, and the second portion 1034*b* falls within this region of the active area 1014. Due to the swelling of the active area 1014 at the tooth portion 1014*t*, the second portion 1034*b* of the butted contact 1034 is further spaced apart from the isolation feature 1004, leaving gap L and gap M on either side of the second portion 1034*b*. Gap L occurs at the tooth portion 1014*t* and is measured from one side of the second portion 1034*b* of the butted contact 1034 to the isolation feature 1004. Gap M occurs at the wing portion 1014*b* and is measured from another side of the second portion 1034*b* to the isolation feature 1004. Gap L is measured between about 0 and 30 nm (0<gap L<30 nm). For example, if the gap L is less than 0, the butted contact 1034 would extend across the left edge of the tooth portion 1014*t* of the active area 1014 to land on the isolation feature 1004, which in turn results in junction leakage. On the other hand, if the gap L is greater than 30 nm, a leakage current may occur between the active area 1014 and active area 1012 shown in FIG. 2. As a result, if gap L is between about 0 and 30 nm, the leakage current resulting from the densely arranged active areas 1012 and 1014 can be prevented, and the junction leakage between the butted contact 1034 and the isolation feature 1004 can be prevented as well. In other words, a minimum distance from the second portion 1034*b* of the butted contact 1034 to a boundary of the tooth portion 1014*t* of the active area 1014 along the second direction (horizontal direction in FIG. 4) is greater than 0 and less than or equal to 30 nm. Gap M is measured between about 0 and 20 nm (0<gap M<20 nm). For example, if the gap M is less than 0, the butted contact 1034 would extend across the right edge of the active area 1014 to land on the isolation feature 1004, which in turn results in junction leakage. On the other hand, if the gap M is greater than 20 nm, a leakage current may occur between the active area 1014 and the active area 1016. As a result, if the gap M is between about 0 and 20 nm, the leakage current resulting from the densely arranged active areas 1014 and 1016 can be prevented, and the junction leakage between the butted contact 1034 and the isolation feature 1004 can be prevented as well. In other words, a minimum distance from the second portion 1034*b* of the butted contact 1034 to a boundary of the wing portion 1014*b* of the active area 1014 along the second direction (horizontal direction in FIG. 4) is greater than 0 and less than or equal to 20 nm. The second portion 1034*b* of the butted contact 1034 falls within the enclosure defined by the active area 1014 with sufficient gap between the butted contact 1034 and the isolation feature 1004. The gap L and gap M allows a buffer zone that prevents contact and isolation feature from overlapping. The junction leakage path is minimized because the second portion 1034*b* of the butted contact 1034 is enclosed by the active area 1014 with buffering gaps on each side.

Likewise the gate electrode 1026 overlies on a portion of the active area 1016 and spans across the active area 1014 to form the pull up transistor PU-1. The overlap region between the gate electrode 1026 and the active area 1016 occurs at the wing portion 1016*b* of the active area 1016. A width of the wing portion 1016*b* that overlaps the gate electrode 1026 accounts for between about 0 and 50% (0≤overlap region<50%) of the width $W_G$ of the gate electrode. The gate electrode 1026 has a larger portion lands on the isolation feature 1004 than the active area 1016. The tooth portion 1016*t* of the active area 1016 does not overlap with the gate electrode 1026. The tooth portion 1016*t* is positioned between the gate electrodes 1024 and 1026 and distanced apart from the gate electrode 1024 (PU-2).

Reference is still made to FIG. 4. The butted contact 1036 shorts the storage node bar SNB to the gate electrode 1026 of the first inverter. The butted contact 1036 has a first portion 1036*a* that lands on the gate electrode 1026 and a second portion 1036*b* that lands on the active area 1016. The first portion 1036*a* of the butted contact 1036 extends to the second portion 1036*b* continuously. A width of the first portion 1036*a* that overlaps the gate electrode 1026 accounts for between about 30 and 100% (30≤overlap region≤100%) of the width $W_G$ of the gate electrode. The edges of the first portion 1036*a* are distanced from the edges of the gate electrode 1026.

Reference is still made to FIG. 4. The butted contact 1036 spans across from the gate electrode 1026 to the active area 1016. The second portion 1036*b* lands on the wing portion 1016*b* and tooth portion 1016*t*. The second portion 1036*b* of the butted contact 1036 has a width $W_C$ that is smaller than the combined width $W_A$ of the tooth portion 1016*t* and the wing portion 1016*b*. The second portion 1036*b* falls within this region of the active area 1016 with sufficient gap between the butted contact 1036 and the isolation feature 1004. The arrangement of the active areas 1014 and 1016, gate electrodes 1024 and 1026, and butted contacts 1034 and 1036 may be seen as inverted mirror image to each other.

The 6T SRAM bit is used herein for purposes of illustration, but it is understood that the example embodiment applies equally well to other SRAM bit designs. For example, the example embodiment may be implemented in 8T or 10T SRAM bit designs.

Figure 5:
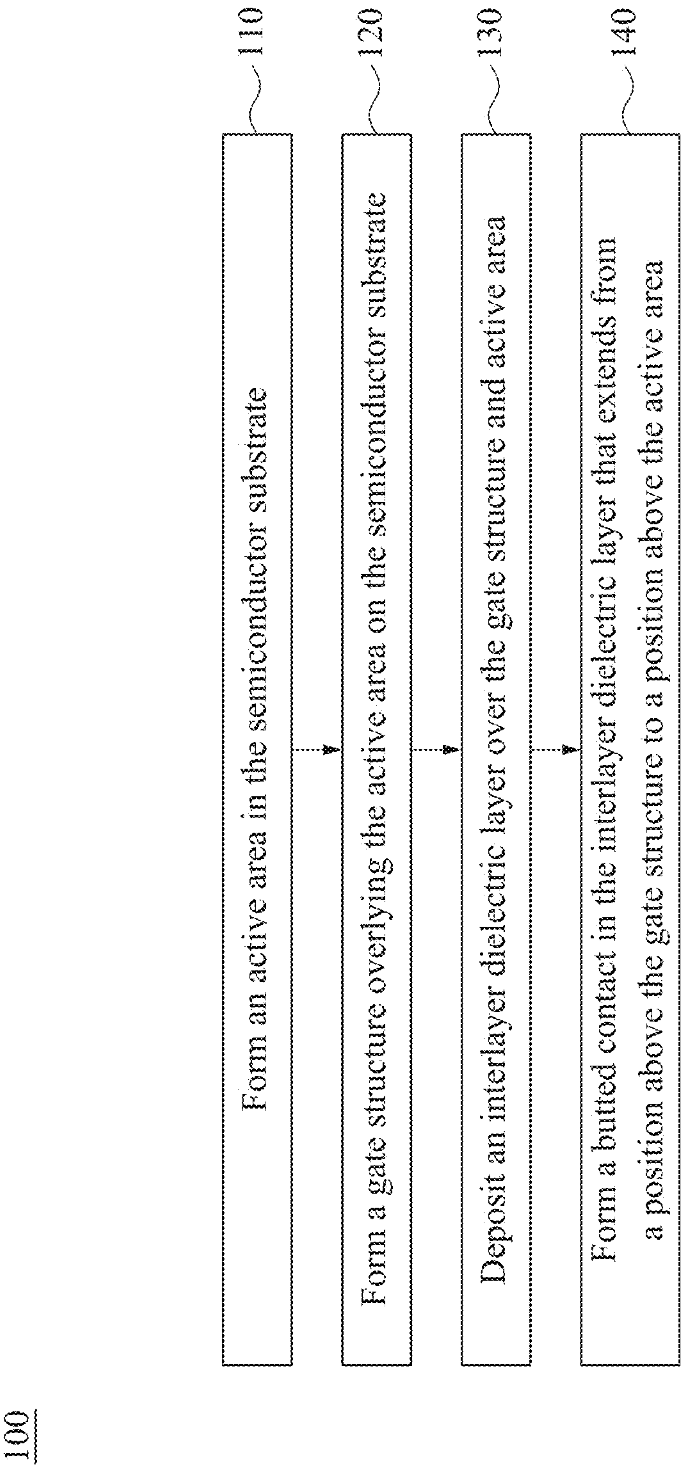
FIG. 5 is a flow chart illustrating a method of fabricating an integrated circuit structure in accordance with some embodiments of the instant disclosure.

Reference is made to FIG. 5, showing a flow chart of a method 100 of fabricating an integrated circuit structure in accordance with some embodiments of the instant disclosure. The method begins with operation 110 in which an active area is formed in the semiconductor substrate. A stem portion, a wing portion, and a tooth portion of the active area are formed in operation 110. The wing portion is on either side of the stem portion and offsetting therefrom. The tooth portion extends from the wing portion and is further away from the stem portion. Subsequently, operation 120 is performed. A gate structure is formed overlying the active area on the semiconductor substrate. The method continues with operation 130 in which an interlayer dielectric layer is deposited over the gate structure and active area. The method continues with operation 140 in which a butted contact is formed in the interlayer dielectric layer that extends from a position above the gate structure to a position above the active area. The discussion that follows illustrates embodiments of semiconductor devices that can be fabricated according to the method 100 of FIG. 5. While method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIGS. 6-11 are cross-sectional views of a portion of the SRAM bit cell layout 1100 along line AA' of FIG. 2 at various stages in a butted contact formation process.

Figure 6:
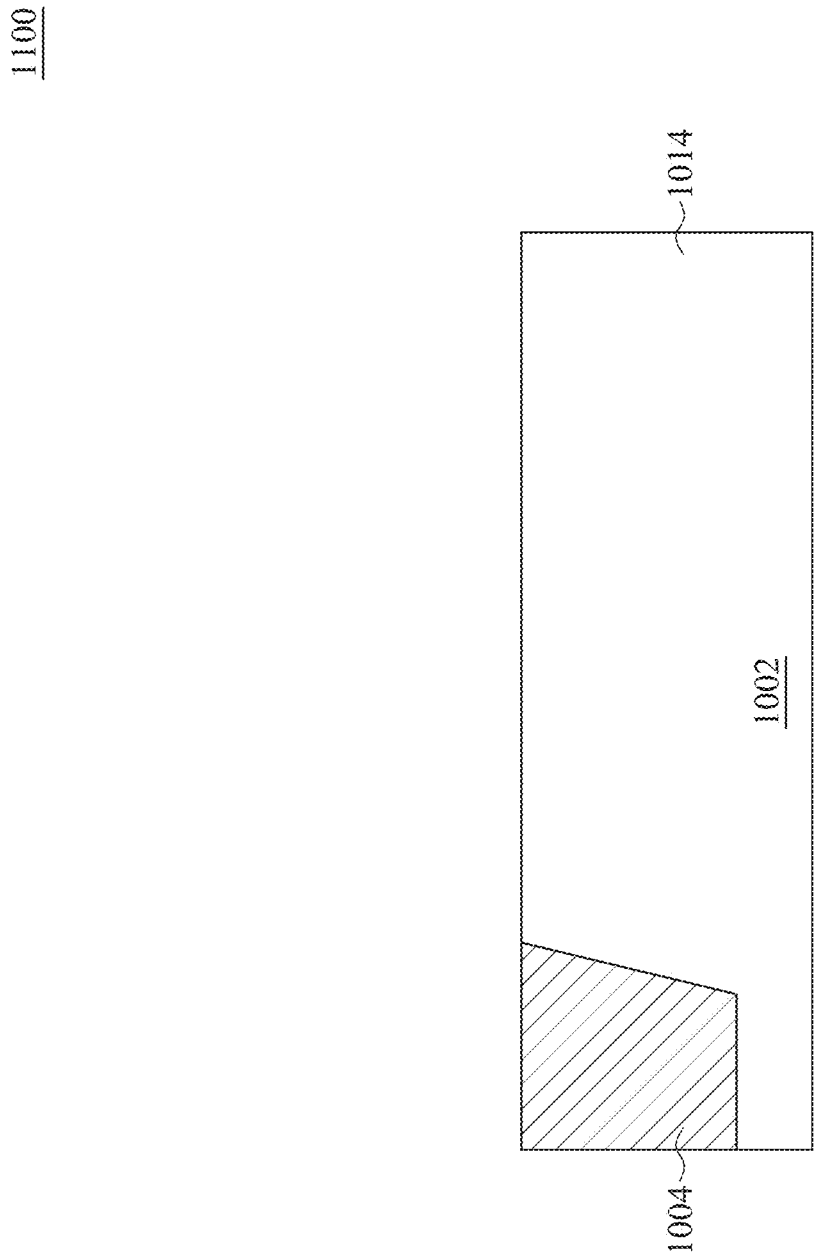
FIGS. 6-11 are cross-sectional views of a portion of the SRAM bit cell circuit along line AA' of FIG. 2 at various stages in a butted contact formation process in accordance with some embodiments of the instant disclosure.

Reference is made to FIG. 6 and operation 110 of FIG. 5. The semiconductor substrate 1002 includes silicon. Alternatively, the semiconductor substrate 1002 includes germanium, silicon germanium or other proper semiconductor materials. The semiconductor substrate 1002 may include other proper features and structures. In some embodiments, the semiconductor substrate 1002 employs a layer of semiconductor material formed over an insulating layer on a supporting bulk wafer for isolation. The technology and structure are referred to as semiconductor on isolation (SOI). The SOI structure can be formed by different techniques including separation by implanted oxygen (SIMOX), bonding and etching back (BESOI), and zone melting and recrystallization (ZMR). Active areas 1012, 1014, 1016 and 1018 are defined in the semiconductor substrate 1002 by isolation features 1004 and are isolated from each other by the isolation features 1004. The isolation features 1004 are formed in the semiconductor substrate 1002 with a proper technology. In some embodiments, the isolation features 1004 are formed by a shallow trench isolation (STI) technique. In alternative embodiments, the isolation features are alternatively formed by a local oxidation of silicon (LOCOS) technique. In yet some other embodiments, the formation of the STI features includes etching a trench in a substrate and filling the trench by one or more insulator materials such as silicon oxide, silicon nitride, or silicon oxynitride. The filled trench may have a multi-layer structure such as a thermal oxide liner layer with silicon nitride filling the trench. The active areas 1012, 1014, 1016 and 1018 are defined in the semiconductor substrate 1002 upon the formation of the isolation features 1004.

Reference is made to FIG. 4 in conjunction with FIG. 6. FIG. 6 shows a portion of the isolation feature 1004 and the active area 1014. The active area 1014 includes the stem portion 1014*a* and wing portion 1014*b* on either side of the stem portion 1014*a*. The wing portion 1014*b* offsets from the stem portion 1014*a*, and the tooth portion 1014*t* extends from the wing portion and further shifts away from the stem portion 1014*a* to create an irregular active area 1014.

Figure 7:
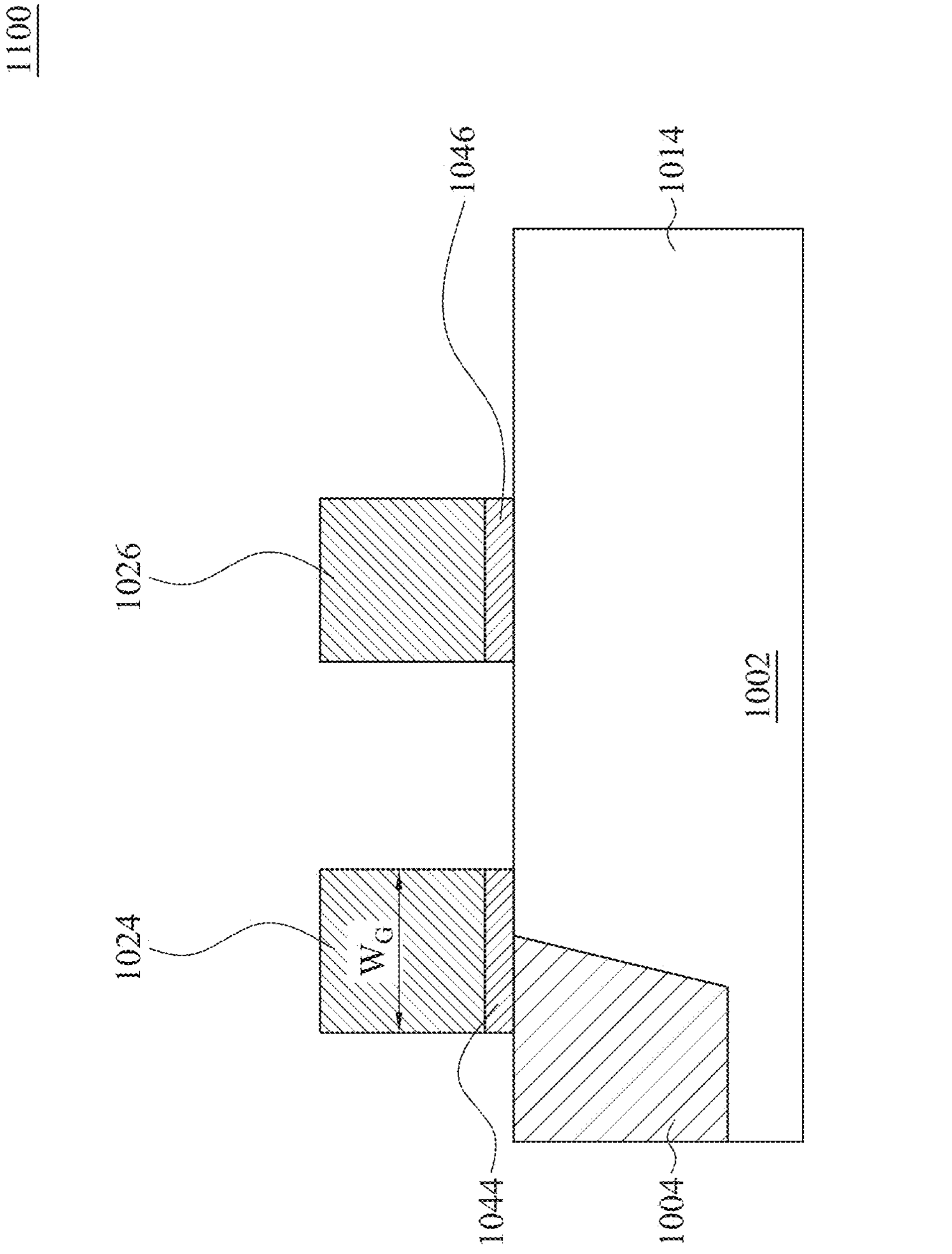

Reference is made to FIG. 7 and operation 120 in FIG. 1. Gate structures are formed on the semiconductor substrate 1002. The gate structures include gate dielectric layers 1044 and 1046 (such as silicon oxide) and gate electrodes 1024 and 1026 (such as doped polysilicon) disposed on the gate dielectric layers 1044 and 1046. In alternative embodiments, the gate structure alternatively or additionally includes other proper materials for circuit performance and manufacturing integration. For example, the gate dielectric layers 1044 and 1046 include high k dielectric material layers. The gate electrodes 1024 and 1026 include metal, such as aluminum, copper, tungsten or other proper conductive materials. The gate electrodes 1024 and 1026 oriented in a first direction and configured with the active areas 1014 and 1016 to form the pull-up devices and pull-down devices.

Reference is still made to FIG. 7. The gate dielectric layer 1044 and gate electrode 1024 sit on the junction of the isolation feature 1004 and the active area 1014. The gate structure that overlies the isolation feature 1004 is larger than that overlies the active area 1014. More specifically, the overlap region between the gate electrode 1024 (gate dielectric layer 1044) and the active area 1014 ranges between 0 and 50% (0≤overlap region<50%) of the square of the gate electrode 1024 width WG (WG2). By minimizing the overlap region between the gate dielectric layer 1044 and the active area 1014, the gate leakage path shrinks. The gate electrode 1026 and the gate dielectric layer 1046 over the active area 1014 will form into the pull up transistor PU-1.

Figure 8:
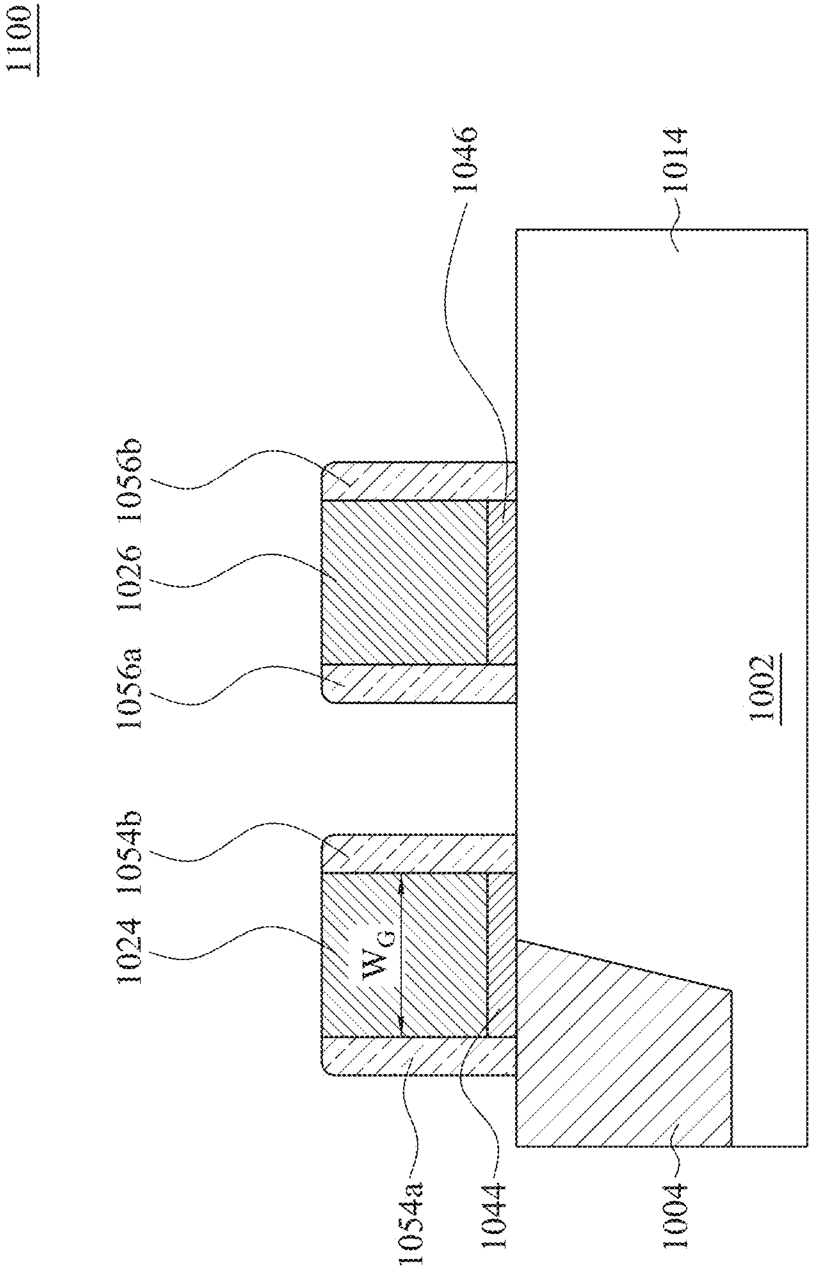

Reference is made to FIG. 8. Sidewall spacers 1054*a* and 1054*b* abut on either side of the gate electrode 1024 and gate dielectric layer 1044. Sidewall spacers 1056*a* and 1056*b* abut on either side of the gate electrode 1026 and gate dielectric layer 1046. The boundary between the active area 1014 and the gate electrode 1024 (gate dielectric layer 1044) does not touch the sidewall spacers 1054*b* but has been moved completely under the gate electrode 1024 (gate dielectric layer 1044).

Figure 9:
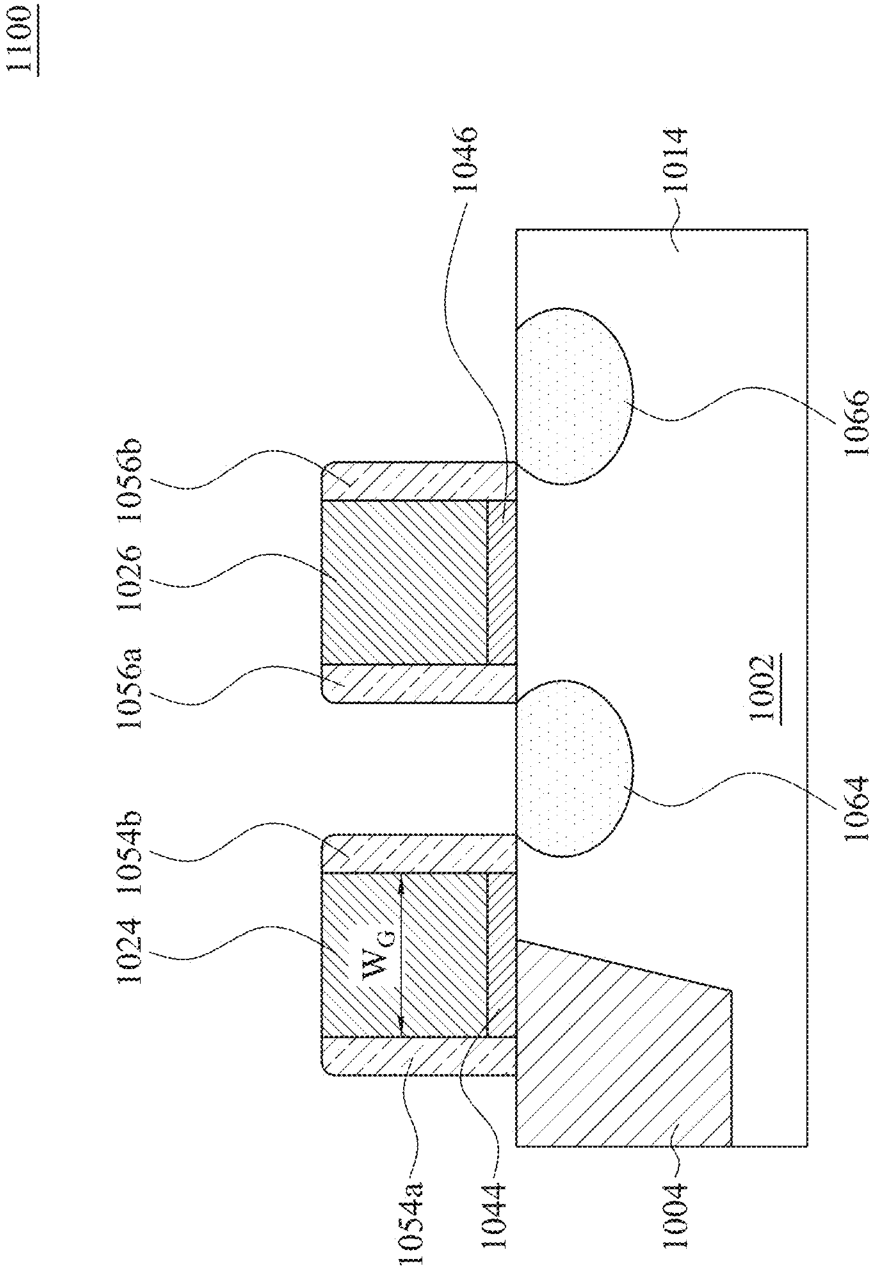

Reference is made to FIG. 9 and operation 110 in FIG. 5. Source and drain regions 1064 and 1066 are formed by implanting the active area 1014. Impurities are introduced to the source and drain regions 1064 and 1066 during the implantation.

Figure 10:
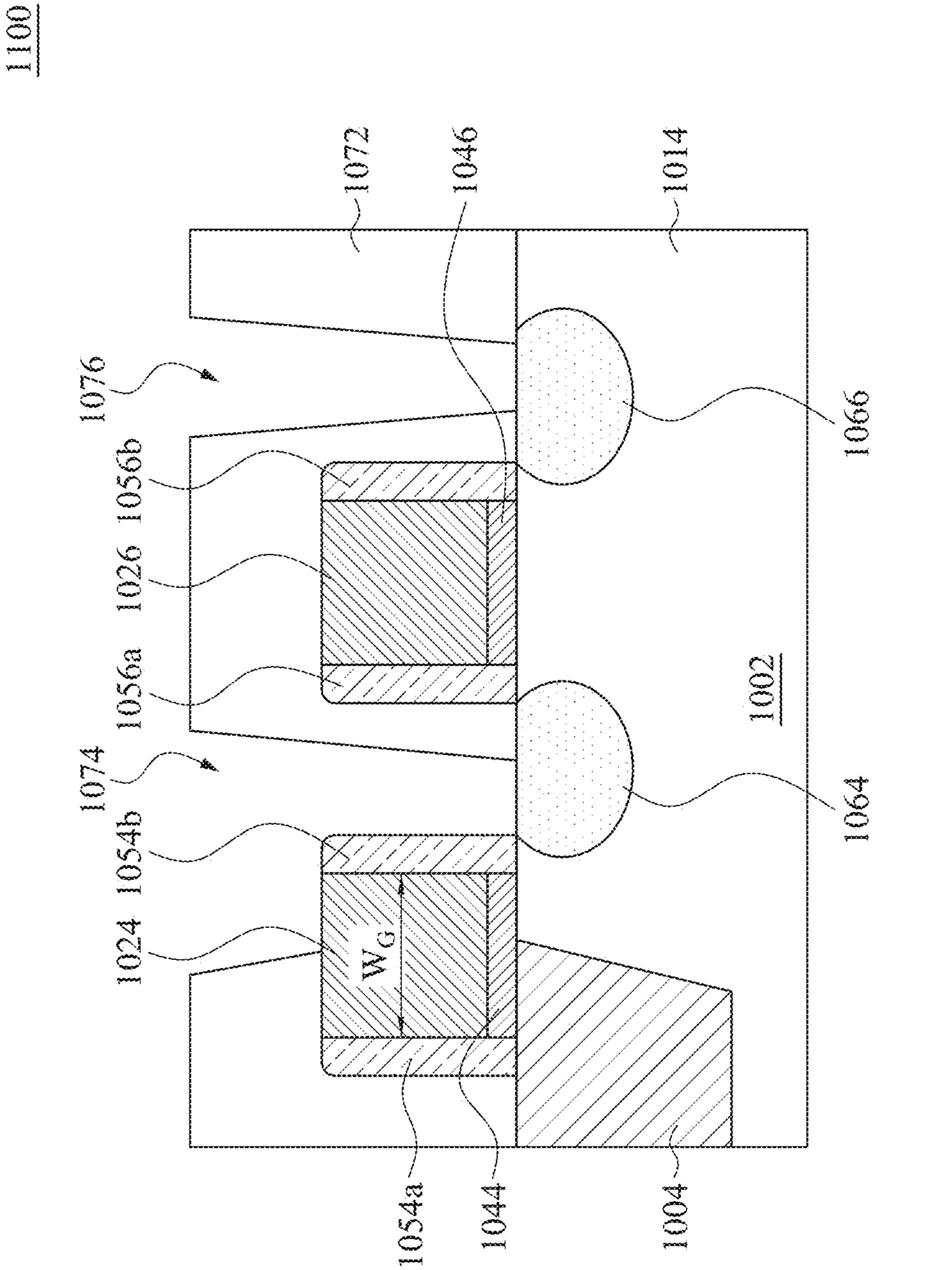

Reference is made to FIG. 10 and operation 130 in FIG. 5. An interlayer dielectric layer 1072 is deposited on the semiconductor substrate 1002 over the gate structures and active area. A contact opening 1076 to the source/drain region 1066 is formed. A butted contact opening 1074 to the gate electrode 1024, sidewall spacer 1054*b* and source/drain region 1064 in the active area 1014 is also formed. In some embodiments, a photoresist layer (not shown) is formed on the interlayer dielectric layer 1072 and then patterned to define the position of the butted contact opening 1074 and the contact opening 1076. The interlayer dielectric layer 1072 is then etched according to the patterned photoresist layer to form the butted contact opening 1074 and the contact opening 1076.

Figure 11:
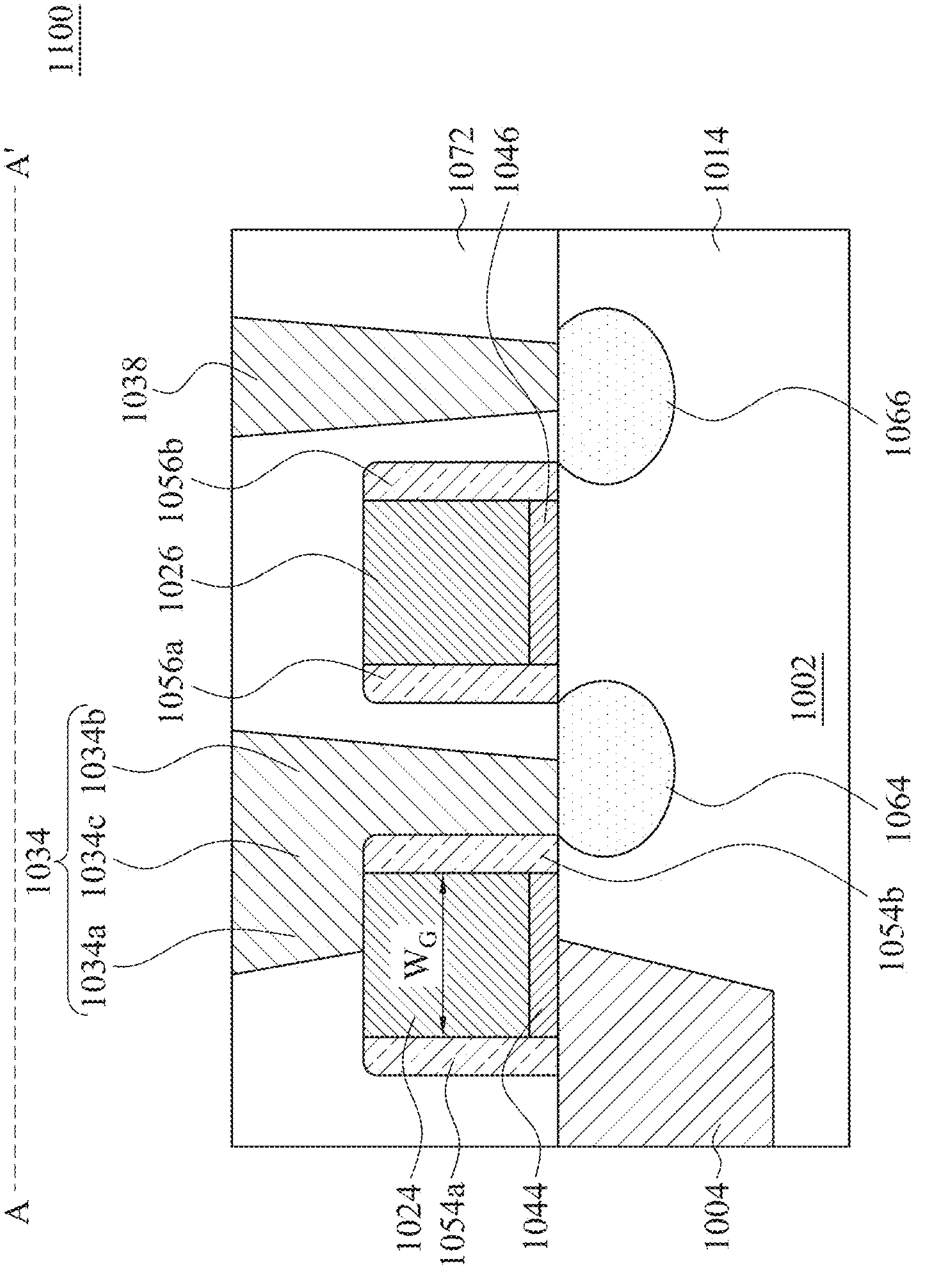

Reference is made to FIG. 11 and operation 140 in FIG. 1. The butted contact 1034 to the gate electrode 1024 and active area 1014 and contact 1032 to the source/drain region 1066 are formed. Metal deposition processes may be used to fill conductive contact materials, such as copper, titanium, tantalum, tungsten, aluminum, or alloys thereof, in the butted contact opening 1074 and contact opening 1076. Then, planarization processes such as a chemical mechanical polishing (CMP) process may be applied on the semiconductor substrate surface to remove the excess tungsten formation on the semiconductor substrate surface, providing a substantially flat semiconductor substrate surface preferable for the subsequent processing steps. The first portion 1034*a* of the butted contact 1034 lands on the gate electrode 1024. The second portion 1034*b* of the butted contact 1034 lands on the tooth portion 1014*t* of the active area 1014 as shown in FIG. 4. As the first portion 1034*a* extends to the second portion 1034*b*, approximately between 5% and 40% of the butted contact 1034 lands on the sidewall spacer 1054*b* without landing on the isolation feature 1004 to avoid junction leakage between the first portion 1034*a* of the butted contact 1034 and the isolation feature 1004. This transition portion 1034*c* of the butted contact 1034 does not make direct contact with the gate electrode 1024 and active area 1014. Approximately between 10 and 60% of the entire butted contact 1034 lands on the gate electrode 1024. That is, the first portion 1034*a* of the butted contact 1034 accounts for between about 10 and 60% of the entire butted contact 1034. This ratio is advantageous for the SRAM performance (e.g., improved contact resistance between the butted contact 1034 and the gate electrode 1024 in comparison with other approaches). Approximately between 10% and 80% of the entire butted contact 1034 lands on the active area 1014. That is, the second portion 1034*b* of the butted contact 1034 accounts for between about 10% and 80% of the entire butted contact 1034. This ratio is advantageous for the SRAM performance (e.g., improved contact resistance between the butted contact 1034 and the active area 1014 in comparison with other approaches).

Figure 12:
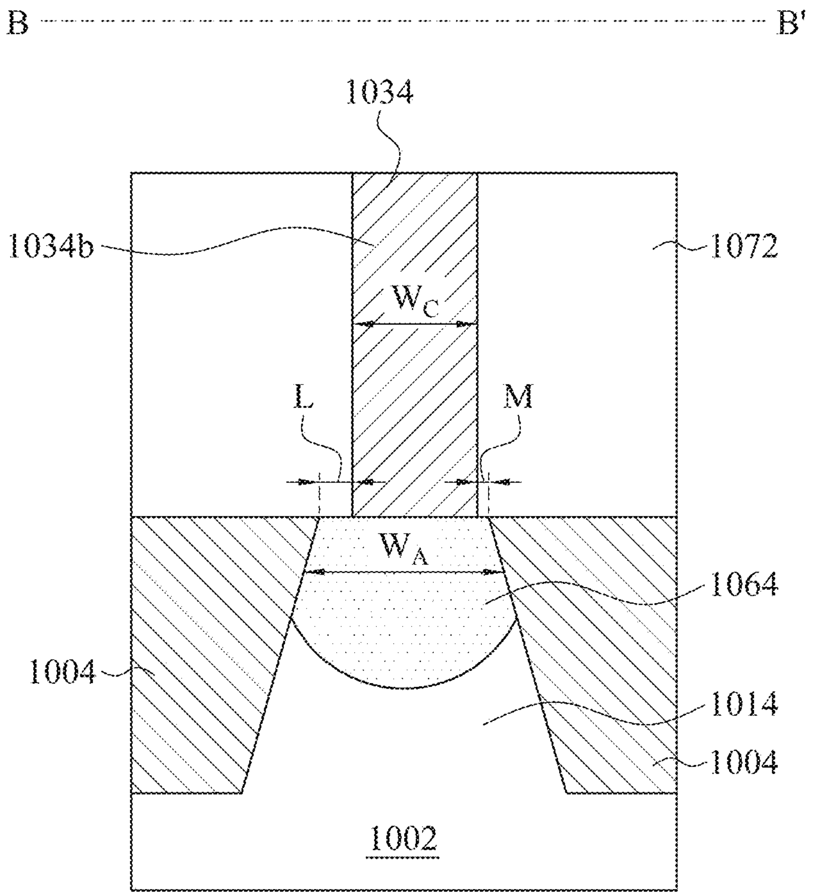
FIG. 12 illustrates a portion of the SRAM bit cell circuit along line BB' in accordance with some embodiments of the instant disclosure.

Reference is made to FIG. 12, illustrating a cross-sectional view of the layout 1100 along line BB' of FIG. 2. The width $W_A$ of the active area 1014, which includes the wing portion 1014*b* and the tooth portion 1014*t*, is broader than the width WC of the butted contact 1034. One side of the butted contact 1034 is spaced apart from the isolation feature 1004 by at least the gap L. The other side of the butted contact 1034 is spaced art from the isolation feature 1004 by at least the gap M. A source/drain contact 1038 is formed to electrically connect the source and drain region 1066 to an upper layer.

Figure 13:
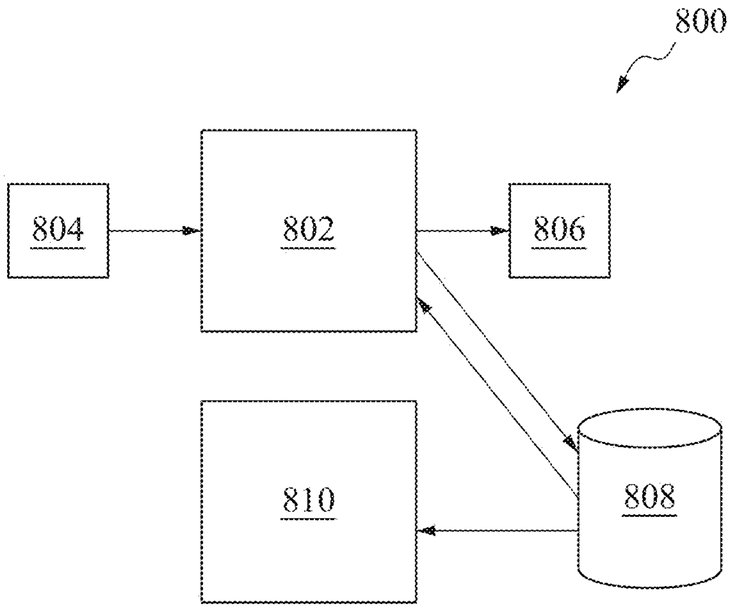
FIG. 13 illustrates a processing system to generate one or more of the above described layout embodiments.

Referring is made to FIG. 13, illustrating a processing system to generate one or more of the above described layout embodiments. Processing system 800 includes a processor 802, which may include a central processing unit, an input/output circuitry, a signal processing circuitry, and a volatile and/or a non-volatile memory. Processor 802 receives input, such as user input, from input device 804. The input device 804 may include one or more of a keyboard, a mouse, a tablet, a contact sensitive surface, a stylus, a microphone, and the like. The processor 802 may also receive input, such as standard cells, cell libraries, models, and the like, from a machine readable permanent storage medium 808. The machine readable permanent storage medium may be located locally to the processor 802, or may be remote from the processor 802, in which communications between the processor 802 and the machine readable permanent storage medium 808 occur over a network, such as a telephone network, the Internet, a local area network, wide area network, or the like. The machine readable permanent storage medium 808 may include one or more of a hard disk, magnetic storage, optical storage, non-volatile memory storage, and the like. Included in the machine readable permanent storage medium 808 may be database software for organizing data and instructions stored on the machine readable permanent storage medium 808. The processing system 800 may include an output device 806, such as one or more of a display device, speaker, and the like for outputting information to a user. As described above, the processor 802 generates a layout for an integrated circuit (e.g., the layout as shown in FIG. 2). The layout may be stored in the machine readable permanent storage medium 808. One or more integrated circuit manufacturing machines, such as a photomask generator 810 may communicate with the machine readable permanent storage medium 808, either locally or over a network, either directly or via an intermediate processor such as processor 802. In some embodiments, the photomask generator 810 generates one or more photomasks to be used in the manufacture of an integrated circuit, in conformance with a layout stored in the machine readable permanent storage medium 808.

In some embodiments, the layout 1100 is represented by a plurality of masks generated by one or more processors and/or stored in one or more non-transitory computer-readable media. Other formats for representing the layout 1100 are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, the layout 1100 is presented by at least one first mask corresponding to the active areas 1012, 1014, 1016, and 1018, at least one second mask corresponding to the gate electrodes 1022, 1024, 1026, and 1028, and at least one third mask corresponding to the butted contact 1034 and/or the source/drain contact 1038.

With such configuration, the reduced overlap region between the active area and the gate electrode minimizes gate leakage path, and the increased distance between the butted contact and the isolation feature prevents junction leakage between the butted contact and the isolation feature. The irregular shape of the active area including a tooth portion that widens the area where the butted contact lands and provides a buffer zone between the butted contact and the isolation feature. As a result, the standby current ($I_{sb}$) shows a great reduction by about 50% compared with conventional active area design and remains stable through device operation.

In some embodiments, an SRAM structure includes a first gate strip, a second gate strip, a first active region and a second active region. The first gate strip and the second gate strip extend along a first direction. The first active region extends across the first gate strip from a top view, and forms a first pull-up transistor with the first gate strip. The second active region is next to the first active region. The second active region extends across the second gate strip from the top view, and forms a second pull-up transistor with the second gate strip. From the top view the first active region has a first stepped sidewall facing away from the second active region. The first stepped sidewall has a first side surface farthest from the second active region, a second side surface set back from the first side surface along the first direction, and a third side surface set back from the second side surface along the first direction.

In some embodiments, an SRAM structure includes a first gate strip, a second gate strip, and an active region. The second gate strip extends parallel to the first gate strip. The active region extends across the first gate strip and terminates at a position overlapping the second gate strip from a top view. The active region forms a pull-up transistor with the first gate strip but forms no transistor with the second gate strip. From the top view the active region extends past a first longest side of the second gate strip by a first non-zero distance less than half of a dimension of a shortest side of the second gate strip.

In some embodiments, an SRAM structure includes a first gate strip, a second gate strip, an active region and a butted contact. The first gate strip in a first row of gate strips. The second gate strip in a second row of gate strips next to the first row of gate strips. The active region extends across the first gate strip from a top view, and forms a pull-up transistor with the first gate strip. The butted contact electrically connects second gate strip and a source/drain region of the pull-up transistor formed in the active region. From a top view the butted contact has an upper portion and a lower portion laterally offset from the upper portion. The upper portion of the butted contact extends past an upper side of the active region to the second gate strip, and the lower portion of the butt contact entirely overlaps the active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming an isolation region in a substrate, the isolation region defining a first active region and a second active region;

forming a first gate structure extending along a first direction across the first active region, the first gate structure and the first active region collective forming a first pull-up transistor of an static random-access memory (SRAM) cell; and forming a second gate structure extending along the first direction across the second active region, the second gate structure and the second active region forming a second pull-up transistor of the SRAM cell, wherein from a top view, the first active region has a first non-linear sidewall structure facing away from the second active region, the first non-linear sidewall structure comprises a first side surface positioned farthest from the second active region, a second side surface recessed from the first side surface in the first direction, and a third side surface recessed from the second side surface in the first direction.

2. The method of claim 1, wherein forming the isolation region comprises etching trenches in the substrate, and filling the trenches with a dielectric material.

3. The method of claim 1, wherein from a cross-sectional view, the second gate structure has a first sidewall on the first active region, and a second sidewall on the isolation region.

4. The method of claim 1, wherein forming the first gate structure comprises forming a gate dielectric layer over the first active region and a gate metal layer over the gate dielectric layer.

5. The method of claim 1, wherein forming the second gate structure comprises forming a gate dielectric layer over the second active region and a gate metal layer over the gate dielectric layer.

6. The method of claim 1, wherein from the top view, the second side surface of the first non-linear sidewall structure of the first active region is shorter than the first side surface of the first non-linear sidewall structure of the first active region.

7. The method of claim 6, wherein from the top view, the first side surface of the first non-linear sidewall structure of the first active region is shorter than the third side surface of the first non-linear sidewall structure of the first active region.

8. The method of claim 1, wherein from the top view, the second active region has a second non-linear sidewall structure facing away from the first active region, the second non-linear sidewall structure comprises a fourth side surface positioned farthest from the first active region, a fifth side surface recessed from the fourth side surface in the first direction, and a sixth side surface recessed from the fifth side surface in the first direction.

9. The method of claim 8, wherein the second gate structure extends across the sixth side surface of the second non-linear sidewall structure of the second active region.

10. The method of claim 8, wherein from the top view, the fifth side surface of the second non-linear sidewall structure of the second active region is shorter than the fourth side surface of the second non-linear sidewall structure of the second active region.

11. The method of claim 10, wherein from the top view, the fourth side surface of the second non-linear sidewall structure of the second active region is shorter than the sixth side surface of the second non-linear sidewall structure of the second active region.

12. A method comprising:

forming an isolation region in a substrate, the isolation region defining a first active region and a second active region;

forming a first gate structure extending along a first direction across the first active region, the first gate structure and the first active region collective forming a first pull-up transistor of an static random-access memory (SRAM) cell; and forming a second gate structure extending along the first direction across the second active region, the second gate structure and the second active region forming a second pull-up transistor of the SRAM cell, wherein when viewed from above, the first active region comprises a non-linear sidewall structure oriented away from the second active region, the non-linear sidewall structure comprises a plurality of first surfaces extending along a second direction different from the first direction, and a plurality of second surfaces alternating with the plurality of first surfaces, wherein the plurality of second surfaces extend along the first direction.

13. The method of claim 12, wherein the first direction is perpendicular to the second direction.

14. The method of claim 12, wherein when viewed from above, a second one of the plurality of first surfaces is set back from a first one of the plurality of first surfaces along the first direction, and a third one of the plurality of first surfaces is set back from the second one of the plurality of first surfaces along the first direction.

15. The method of claim 14, wherein when viewed from above, the third one of the plurality of first surfaces is longer than the first one of the plurality of first surfaces.

16. The method of claim 15, wherein when viewed from above, the first one of the plurality of first surfaces is longer than the second one of the plurality of first surfaces.

17. The method of claim 12, wherein when viewed from above, the plurality of second surfaces have different lengths.

18. A method comprising:

forming an isolation region in a substrate, the isolation region defining an active region;

forming a first gate structure extending along a first direction across the active region;

forming a second gate structure extending along the first direction over a longitudinal end of the active region;

forming an interlayer dielectric (ILD) layer over the first and second gate structures; and forming a butted contact in the ILD layer, the butted contact electrically connecting the second gate structure and an source/drain region in the active region, wherein from a top view, the butted contact comprises a non-linear sidewall structure comprising a first longitudinal surface extending along a second direction different from the first direction, a second longitudinal surface offset from the first longitudinal surface, and an intermediary surface connecting the first longitudinal surface and the second longitudinal surface, wherein the intermediary surface has a first portion overlapping with the active region and a second portion non-overlapping with the active region.

19. The method of claim 18, wherein from the top view, the first longitudinal surface of the non-linear sidewall structure of the butted contact has a first portion overlapping with the second gate structure and a second portion overlapping with the isolation region.

20. The method of claim 18, wherein from the top view, the second longitudinal surface of the non-linear sidewall structure of the butted contact entirely overlaps with the active region.

* * * * *